(12) United States Patent
Kopp et al.

(10) Patent No.: US 11,709,171 B2
(45) Date of Patent: Jul. 25, 2023

(54) LABORATORY SYSTEM, LABORATORY SAMPLE DISTRIBUTION SYSTEM AND LABORATORY AUTOMATION SYSTEM

(71) Applicant: Roche Diagnostics Operations, Inc., Indianapolis, IN (US)

(72) Inventors: Martin Kopp, Huenenberg See (CH); Oliver Gutmann, Thalwil (CH); Norbert Schmitt, Lucerne (CH)

(73) Assignee: ROCHE DIAGNOSTICS OPERATIONS, INC., Indianapolis, IN (US)

( * ) Notice: Subject to any disclaimer, the term of this patent is extended or adjusted under 35 U.S.C. 154(b) by 160 days.

(21) Appl. No.: 16/291,562

(22) Filed: Mar. 4, 2019

(65) Prior Publication Data
US 2019/0285660 A1     Sep. 19, 2019

(30) Foreign Application Priority Data
Mar. 16, 2018  (EP) ..................................... 18162202

(51) Int. Cl.
*G01N 35/00*      (2006.01)
*G01N 35/04*      (2006.01)
*G01R 33/00*      (2006.01)

(52) U.S. Cl.
CPC ....... *G01N 35/00732* (2013.01); *G01N 35/04* (2013.01); *G01R 33/0035* (2013.01);
(Continued)

(58) Field of Classification Search
CPC ............. G01N 35/00732; G01N 35/04; G01N 2035/0401; G01N 2035/00633; G01N 2035/00643; G01N 2035/00762; G01N 2035/00801; G01N 2035/0477; G01N 2035/0432; G01N 2035/0406; G01N 35/00613; G01N 2035/00821; G01N 2035/00742; G01N 2035/0441;
(Continued)

(56) References Cited

U.S. PATENT DOCUMENTS 3,273,727 A   9/1966  Rogers et al.
3,653,485 A   4/1972  Donlon
(Continued)

FOREIGN PATENT DOCUMENTS

CN    201045617 Y    4/2008
CN    102109530 A    6/2011
(Continued)

*Primary Examiner* — Jill A Warden
*Assistant Examiner* — John McGuirk
(74) *Attorney, Agent, or Firm* — Woodard, Emhardt, Henry, Reeves & Wagner, LLP (57) ABSTRACT

A laboratory system for a laboratory automation system is presented. The laboratory system comprises a sample container carrier. The sample container carrier is configured to carry a laboratory sample container and comprises a removal detector. The removal detector is configured to interact with the laboratory sample container to detect a removal of the carried laboratory sample container from the sample container carrier. Furthermore, the laboratory system is configured to determine based on the detected removal that a before valid logic assignment of the sample container carrier to the carried laboratory sample container is invalid.

8 Claims, 5 Drawing Sheets

(52) U.S. Cl.
CPC .............. *G01N 2035/00633* (2013.01); *G01N 2035/00643* (2013.01); *G01N 2035/00762* (2013.01); *G01N 2035/00801* (2013.01); *G01N 2035/0401* (2013.01); *G01N 2035/0477* (2013.01)

(58) Field of Classification Search
CPC . G01R 33/0035; B01L 2300/022; B01L 9/06; B01L 2200/18; B01L 2300/023; B01L 3/5082; B65G 2201/0261; B65G 54/02
See application file for complete search history.

(56) References Cited

U.S. PATENT DOCUMENTS

| | | |
|---|---|---|
| 3,901,656 A | 8/1975 | Durkos et al. |
| 4,150,666 A | 4/1979 | Brush |
| 4,395,164 A | 7/1983 | Beltrop et al. |
| 4,544,068 A | 10/1985 | Cohen |
| 4,595,562 A | 6/1986 | Liston et al. |
| 4,771,237 A | 9/1988 | Daley |
| 5,120,506 A | 6/1992 | Saito et al. |
| 5,295,570 A | 3/1994 | Grecksch et al. |
| 5,309,049 A | 5/1994 | Kawada et al. |
| 5,457,368 A | 10/1995 | Jacobsen et al. |
| 5,523,131 A | 6/1996 | Isaacs et al. |
| 5,530,345 A | 6/1996 | Murari et al. |
| 5,636,548 A | 6/1997 | Dunn et al. |
| 5,641,054 A | 6/1997 | Mori et al. |
| 5,651,941 A | 7/1997 | Stark et al. |
| 5,720,377 A | 2/1998 | Lapeus et al. |
| 5,735,387 A | 4/1998 | Polaniec et al. |
| 5,788,929 A | 8/1998 | Nesti |
| 6,045,319 A | 4/2000 | Uchida et al. |
| 6,062,398 A | 5/2000 | Thalmayr |
| 6,141,602 A | 10/2000 | Igarashi et al. |
| 6,151,535 A | 11/2000 | Ehlers |
| 6,184,596 B1 | 2/2001 | Ohzeki |
| 6,191,507 B1 | 2/2001 | Peltier et al. |
| 6,206,176 B1 | 3/2001 | Blonigan et al. |
| 6,255,614 B1 | 7/2001 | Yamakawa et al. |
| 6,260,360 B1 | 7/2001 | Wheeler |
| 6,279,728 B1 | 8/2001 | Jung et al. |
| 6,293,750 B1 | 9/2001 | Cohen et al. |
| 6,343,690 B1 | 2/2002 | Britton et al. |
| 6,429,016 B1 | 8/2002 | McNeil |
| 6,444,171 B1 | 9/2002 | Sakazume et al. |
| 6,456,944 B1 | 9/2002 | Burkhardt et al. |
| 6,571,934 B1 | 6/2003 | Thompson et al. |
| 7,028,831 B2 | 4/2006 | Veiner |
| 7,078,082 B2 | 7/2006 | Adams |
| 7,122,158 B2 | 10/2006 | Itoh |
| 7,278,532 B2 | 10/2007 | Martin |
| 7,326,565 B2 | 2/2008 | Kokoi et al. |
| 7,425,305 B2 | 9/2008 | Itoh |
| 7,428,957 B2 | 9/2008 | Schaefer |
| 7,578,383 B2 | 8/2009 | Itoh |
| 7,597,187 B2 | 10/2009 | Bausenwein et al. |
| 7,850,914 B2 | 12/2010 | Veiner et al. |
| 7,858,033 B2 | 12/2010 | Itoh |
| 7,875,254 B2 | 1/2011 | Garton et al. |
| 7,939,484 B1 | 5/2011 | Loeffler et al. |
| 8,240,460 B1 | 8/2012 | Bleau et al. |
| 8,281,888 B2 | 10/2012 | Bergmann |
| 8,383,421 B2 | 2/2013 | Yanagida et al. |
| 8,502,422 B2 | 8/2013 | Lykkegaard |
| 8,796,186 B2 | 8/2014 | Shirazi |
| 8,833,544 B2 | 9/2014 | Stoeckle et al. |
| 8,864,030 B2 | 10/2014 | Ohmae |
| 8,973,736 B2 | 3/2015 | Johns et al. |
| 9,056,720 B2 | 6/2015 | Van De Loecht et al. |
| 9,097,691 B2 | 8/2015 | Onizawa et al. |
| 9,187,268 B2 | 11/2015 | Denninger et al. |
| 9,211,543 B2 | 12/2015 | Ohga et al. |
| 9,239,335 B2 | 1/2016 | Heise et al. |
| 9,289,770 B2 | 3/2016 | Lavi |
| 9,309,062 B2 | 4/2016 | Hecht |
| 9,423,410 B2 | 8/2016 | Buehr |
| 9,423,411 B2 | 8/2016 | Riether |
| 9,567,167 B2 | 2/2017 | Sinz |
| 9,575,086 B2 | 2/2017 | Heise et al. |
| 9,593,970 B2 | 3/2017 | Sinz |
| 9,598,243 B2 | 3/2017 | Denninger et al. |
| 9,618,525 B2 | 4/2017 | Malinowski et al. |
| 9,658,241 B2 | 5/2017 | Riether et al. |
| 9,664,703 B2 | 5/2017 | Heise et al. |
| 9,772,342 B2 | 9/2017 | Riether |
| 9,791,468 B2 | 10/2017 | Riether et al. |
| 9,810,706 B2 | 11/2017 | Riether et al. |
| 9,902,572 B2 | 2/2018 | Mahmudimanesh et al. |
| 9,939,455 B2 | 4/2018 | Schneider et al. |
| 9,969,570 B2 | 5/2018 | Heise et al. |
| 9,989,547 B2 | 6/2018 | Pedain |
| 10,006,927 B2 | 6/2018 | Sinz et al. |
| 10,031,150 B2 | 7/2018 | Heise et al. |
| 10,094,843 B2 | 10/2018 | Malinowski et al. |
| 10,119,982 B2 | 11/2018 | Baer |
| 10,126,317 B2 | 11/2018 | Heise et al. |
| 10,160,609 B2 | 12/2018 | Malinowski |
| 10,175,259 B2 | 1/2019 | Riether |
| 10,288,634 B2 | 5/2019 | Kaeppeli |
| 10,352,953 B2 | 7/2019 | Huber et al. |
| 2002/0009391 A1 | 1/2002 | Marquiss et al. |
| 2003/0092185 A1 | 5/2003 | Qureshi et al. |
| 2004/0050836 A1 | 3/2004 | Nesbitt et al. |
| 2004/0084531 A1 | 5/2004 | Itoh |
| 2005/0036907 A1 | 2/2005 | Shoji |
| 2005/0061622 A1 | 3/2005 | Martin |
| 2005/0109580 A1 | 5/2005 | Thompson |
| 2005/0194333 A1 | 9/2005 | Veiner et al. |
| 2005/0196320 A1 | 9/2005 | Veiner et al. |
| 2005/0226770 A1 | 10/2005 | Allen et al. |
| 2005/0242963 A1 | 11/2005 | Oldham et al. |
| 2005/0247790 A1 | 11/2005 | Itoh |
| 2005/0260101 A1 | 11/2005 | Nauck et al. |
| 2005/0271555 A1 | 12/2005 | Itoh |
| 2006/0000296 A1 | 1/2006 | Salter |
| 2006/0047303 A1 | 3/2006 | Ortiz et al. |
| 2006/0219524 A1 | 10/2006 | Kelly et al. |
| 2007/0116611 A1 | 5/2007 | DeMarco |
| 2007/0210090 A1 | 9/2007 | Sixt et al. |
| 2007/0248496 A1 | 10/2007 | Bondioli et al. |
| 2007/0276558 A1 | 11/2007 | Kim |
| 2008/0012511 A1 | 1/2008 | Ono |
| 2008/0029368 A1 | 2/2008 | Komori |
| 2008/0042839 A1* | 2/2008 | Grater .................... G01N 35/04 340/572.1 |
| 2008/0056328 A1 | 3/2008 | Rund et al. |
| 2008/0131961 A1 | 6/2008 | Crees et al. |
| 2009/0004732 A1 | 1/2009 | LaBarre et al. |
| 2009/0022625 A1 | 1/2009 | Lee et al. |
| 2009/0081771 A1 | 3/2009 | Breidford et al. |
| 2009/0128139 A1 | 5/2009 | Drenth et al. |
| 2009/0142844 A1 | 6/2009 | Le Comte |
| 2009/0180931 A1 | 7/2009 | Silbert et al. |
| 2009/0322486 A1 | 12/2009 | Gerstel |
| 2010/0000250 A1 | 1/2010 | Sixt |
| 2010/0123551 A1* | 5/2010 | Fritchie ................... G16H 10/40 340/10.1 |
| 2010/0152895 A1 | 6/2010 | Dai |
| 2010/0175943 A1 | 7/2010 | Bergmann |
| 2010/0186618 A1 | 7/2010 | King et al. |
| 2010/0255529 A1 | 10/2010 | Cocola et al. |
| 2010/0300831 A1 | 12/2010 | Pedrazzini |
| 2010/0312379 A1 | 12/2010 | Pedrazzini |
| 2011/0050213 A1 | 3/2011 | Furukawa |
| 2011/0124038 A1 | 5/2011 | Bishop et al. |
| 2011/0172128 A1 | 7/2011 | Davies et al. |
| 2011/0186406 A1 | 8/2011 | Kraus et al. |
| 2011/0287447 A1 | 11/2011 | Norderhaug et al. |
| 2012/0037696 A1 | 2/2012 | Lavi |
| 2012/0129673 A1 | 5/2012 | Fukugaki et al. |
| 2012/0178170 A1 | 7/2012 | Van Praet |
| 2012/0211645 A1 | 8/2012 | Tullo et al. |

(56) References Cited

U.S. PATENT DOCUMENTS

| | | |
|---|---|---|
| 2012/0275885 A1 | 11/2012 | Furrer et al. |
| 2012/0282683 A1 | 11/2012 | Mototsu |
| 2012/0295358 A1 | 11/2012 | Ariff et al. |
| 2012/0310401 A1 | 12/2012 | Shah |
| 2013/0153677 A1 | 6/2013 | Leen et al. |
| 2013/0180824 A1 | 7/2013 | Kleinikkink et al. |
| 2013/0263622 A1 | 10/2013 | Mullen et al. |
| 2013/0322992 A1 | 12/2013 | Pedrazzini |
| 2014/0134607 A1* | 5/2014 | Lin .............. G01N 33/5438 435/5 |
| 2014/0170023 A1 | 6/2014 | Saito et al. |
| 2014/0202829 A1 | 7/2014 | Eberhardt et al. |
| 2014/0234949 A1 | 8/2014 | Wasson et al. |
| 2014/0277695 A1* | 9/2014 | Iqbal .............. G01N 35/00732 700/225 |
| 2014/0295562 A1* | 10/2014 | Wakamiya ........ G01N 35/04 436/48 |
| 2015/0014125 A1 | 1/2015 | Hecht |
| 2015/0166265 A1 | 6/2015 | Pollack et al. |
| 2015/0241457 A1 | 8/2015 | Miller |
| 2015/0273468 A1 | 10/2015 | Croquette et al. |
| 2015/0273691 A1 | 10/2015 | Pollack |
| 2015/0276774 A1 | 10/2015 | Pollack |
| 2015/0276775 A1 | 10/2015 | Mellars et al. |
| 2015/0276782 A1 | 10/2015 | Riether |
| 2016/0003859 A1 | 1/2016 | Wenczel et al. |
| 2016/0025756 A1 | 1/2016 | Pollack et al. |
| 2016/0054341 A1 | 2/2016 | Edelmann |
| 2016/0054344 A1* | 2/2016 | Heise .............. G01N 35/04 422/65 |
| 2016/0077120 A1 | 3/2016 | Riether |
| 2016/0132661 A1 | 5/2016 | Dixit et al. |
| 2016/0229565 A1 | 8/2016 | Margner |
| 2017/0108522 A1 | 4/2017 | Baer |
| 2017/0131307 A1 | 5/2017 | Pedain |
| 2017/0131310 A1 | 5/2017 | Volz et al. |
| 2017/0138971 A1 | 5/2017 | Heise et al. |
| 2017/0168079 A1 | 6/2017 | Sinz |
| 2017/0174448 A1 | 6/2017 | Sinz |
| 2017/0184622 A1 | 6/2017 | Sinz et al. |
| 2017/0248623 A1 | 8/2017 | Kaeppeli et al. |
| 2017/0248624 A1 | 8/2017 | Kaeppeli et al. |
| 2017/0363608 A1 | 12/2017 | Sinz |
| 2018/0067141 A1 | 3/2018 | Mahmudimanesh et al. |
| 2018/0106821 A1 | 4/2018 | Vollenweider et al. |
| 2018/0128848 A1 | 5/2018 | Schneider et al. |
| 2018/0156835 A1 | 6/2018 | Hassan |
| 2018/0188280 A1 | 7/2018 | Malinowski |
| 2018/0210000 A1 | 7/2018 | van Mierlo |
| 2018/0210001 A1 | 7/2018 | Reza |
| 2018/0217174 A1 | 8/2018 | Malinowski |
| 2018/0217176 A1 | 8/2018 | Sinz et al. |
| 2018/0224476 A1 | 8/2018 | Birrer et al. |
| 2018/0340951 A1 | 11/2018 | Kaeppell |
| 2018/0340952 A1 | 11/2018 | Kaeppeli et al. |
| 2018/0348244 A1 | 12/2018 | Ren |
| 2018/0348245 A1 | 12/2018 | Schneider et al. |
| 2019/0018027 A1 | 1/2019 | Hoehnel |
| 2019/0076845 A1 | 3/2019 | Huber et al. |
| 2019/0076846 A1 | 3/2019 | Durco et al. |
| 2019/0086433 A1 | 3/2019 | Hermann et al. |
| 2019/0094251 A1 | 3/2019 | Malinowski |
| 2019/0094252 A1 | 3/2019 | Waser et al. |
| 2019/0101468 A1 | 4/2019 | Haldar |
| 2019/0285660 A1 | 9/2019 | Kopp et al. |

FOREIGN PATENT DOCUMENTS

| | | | |
|---|---|---|---|
| CN | 105095927 | | 11/2015 |
| DE | 3909786 A1 | | 9/1990 |
| DE | 102012000665 A1 | | 8/2012 |
| DE | 102011090044 A1 | | 7/2013 |
| EP | 0601213 A1 | | 10/1992 |
| EP | 0775650 A1 | | 5/1997 |
| EP | 0916406 A2 | | 5/1999 |
| EP | 1122194 A1 | | 8/2001 |
| EP | 1524525 A1 | | 4/2005 |
| EP | 2119643 A1 | | 11/2009 |
| EP | 2148117 A1 | | 1/2010 |
| EP | 2327646 A1 | | 6/2011 |
| EP | 2447701 A2 | | 5/2012 |
| EP | 2458389 A1 * | 5/2012 | ....... G01N 35/00732 |
| EP | 2500871 A1 | | 9/2012 |
| EP | 2589968 A1 | | 5/2013 |
| EP | 2502675 B1 | | 2/2014 |
| EP | 2887071 A1 | | 6/2015 |
| EP | 3095739 A1 | | 11/2016 |
| GB | 2165515 A | | 4/1986 |
| JP | S56-147209 A | | 11/1981 |
| JP | 60-223481 A | | 11/1985 |
| JP | 61-081323 A | | 4/1986 |
| JP | S61-069604 A | | 4/1986 |
| JP | S61-094925 A | | 5/1986 |
| JP | S61-174031 A | | 8/1986 |
| JP | S61-217434 A | | 9/1986 |
| JP | S62-100161 A | | 5/1987 |
| JP | S63-31918 A | | 2/1988 |
| JP | S63-48169 A | | 2/1988 |
| JP | S63-82433 U | | 5/1988 |
| JP | S63-290101 A | | 11/1988 |
| JP | 1148966 | | 6/1989 |
| JP | H01-266860 A | | 10/1989 |
| JP | H02-87903 A | | 3/1990 |
| JP | 03-112393 A | | 5/1991 |
| JP | 03-192013 A | | 8/1991 |
| JP | H03-38704 Y2 | | 8/1991 |
| JP | H04-127063 A | | 4/1992 |
| JP | H05-69350 A | | 3/1993 |
| JP | H05-142232 A | | 6/1993 |
| JP | H05-180847 A | | 7/1993 |
| JP | 06-26808 A | | 2/1994 |
| JP | H06-148198 A | | 5/1994 |
| JP | 06-156730 A | | 6/1994 |
| JP | 06-211306 A | | 8/1994 |
| JP | 07-228345 A | | 8/1995 |
| JP | 07-236838 A | | 9/1995 |
| JP | H07-301637 A | | 11/1995 |
| JP | H08-304409 A | | 11/1996 |
| JP | H09-17848 A | | 1/1997 |
| JP | H11-083865 A | | 3/1999 |
| JP | H11-264828 A | | 9/1999 |
| JP | H11-304812 A | | 11/1999 |
| JP | H11-326336 A | | 11/1999 |
| JP | 2000-105243 A | | 4/2000 |
| JP | 2000-105246 A | | 4/2000 |
| JP | 2001-124786 A | | 5/2001 |
| JP | 2001-240245 A | | 9/2001 |
| JP | 2004-028595 A | | 1/2004 |
| JP | 2005-001055 A | | 1/2005 |
| JP | 2005-249740 A | | 9/2005 |
| JP | 2006-106008 A | | 4/2006 |
| JP | 2007-309675 A | | 11/2007 |
| JP | 2007-314262 A | | 12/2007 |
| JP | 2007-322289 A | | 12/2007 |
| JP | 2008032652 | | 2/2008 |
| JP | 2009-036643 A | | 2/2009 |
| JP | 2009-062188 A | | 3/2009 |
| JP | 2009-145188 A | | 7/2009 |
| JP | 2009-300402 A | | 12/2009 |
| JP | 2010-243310 A | | 10/2010 |
| JP | 2010-271204 A | | 12/2010 |
| JP | 2013-172009 A | | 2/2013 |
| JP | 2013-190400 A | | 9/2013 |
| SU | 685591 A1 | | 9/1979 |
| WO | 1996/036437 A1 | | 11/1996 |
| WO | 2003/042048 A3 | | 5/2003 |
| WO | 2007/024540 A1 | | 3/2007 |
| WO | 2008/133708 A1 | | 11/2008 |
| WO | 2009/002358 A1 | | 12/2008 |
| WO | 2010/042722 A1 | | 4/2010 |
| WO | 2012/170636 A1 | | 7/2010 |
| WO | 2010/087303 A1 | | 8/2010 |
| WO | 2010/129715 A1 | | 11/2010 |

(56) References Cited

FOREIGN PATENT DOCUMENTS

| | | |
|---|---|---|
| WO | 2011/013324 A1 | 2/2011 |
| WO | 2012/064940 A1 | 5/2012 |
| WO | 2012/158520 A1 | 11/2012 |
| WO | 2012/158541 A1 | 11/2012 |
| WO | 2013/152089 A1 | 10/2013 |
| WO | 2013/169778 A1 | 11/2013 |
| WO | 2013/177163 A1 | 11/2013 |
| WO | 2014/059134 A1 | 4/2014 |
| WO | 2014/071214 A1 | 5/2014 |
| WO | 2015/104263 A2 | 7/2015 |

* cited by examiner

LABORATORY SYSTEM, LABORATORY SAMPLE DISTRIBUTION SYSTEM AND LABORATORY AUTOMATION SYSTEM

CROSS-REFERENCE TO RELATED APPLICATIONS

This application claims priority to EP 18162202.8, filed Mar. 16, 2018, which is hereby incorporated by reference.

BACKGROUND

The present disclosure generally relates to a laboratory system, a laboratory sample distribution system comprising such a laboratory system and a laboratory automation system comprising such a laboratory system and/or such a laboratory sample distribution system.

Known laboratory automation systems typically comprise a number of analytical stations and a laboratory sample distribution in order to move samples contained by laboratory sample containers carried by sample container carriers to the number of analytical stations. Such a laboratory automation system comprises a memory device adapt to store matching pairs of a unique identification (ID) corresponding to a sample container carrier and a laboratory sample container ID being carried by the sample container carrier, making it possible to control and track laboratory sample containers over a processing path.

However, there is a need for a laboratory system that ensures the integrity of a logic assignment of an analytical result to a sample.

SUMMARY

According to the present disclosure, a laboratory system for a laboratory automation system is presented. The laboratory system can comprise a sample container carrier. The sample container carrier can be configured to carry a laboratory sample container. The laboratory system can also comprise a removal detector. The removal detector can be configured to interact with the laboratory sample container to detect a removal of the carried laboratory sample container from the sample container carrier. The laboratory system can be configured to determine based on the detected removal that a before valid logic assignment of the sample container carrier to the carried laboratory sample container is invalid.

Accordingly, it is a feature of the embodiments of the present disclosure to provide for a laboratory system that ensures the integrity of a logic assignment of an analytical result to a sample. Other features of the embodiments of the present disclosure will be apparent in light of the description of the disclosure embodied herein.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

In the following detailed description of the embodiments, reference is made to the accompanying drawings that form a part hereof, and in which are shown by way of illustration, and not by way of limitation, specific embodiments in which the disclosure may be practiced. It is to be understood that other embodiments may be utilized and that logical, mechanical and electrical changes may be made without departing from the spirit and scope of the present disclosure.

A laboratory system for a laboratory automation system is presented. The laboratory system can comprise a sample container carrier. The sample container carrier can be configured to carry a laboratory sample container and can comprise a removal detector. The removal detector can be configured to interact with the laboratory sample container to detect and in some embodiments, to automatically detect, a removal or an unloading, respectively, of the carried laboratory sample container from the sample container carrier. Furthermore, the laboratory system can be configured to determine and in some embodiments, to automatically determine, based on or in dependence of, respectively, the detected removal that a before valid logic assignment of the sample container carrier to the carried laboratory sample container is invalid.

In one embodiment, when a first laboratory sample carrier carried by the sample container carrier container is unintentionally interchanged such as, for example, by failure or manipulation, with another second laboratory sample container, the logic assignment may be invalid. Thereby, a logic assignment of an analytical result of the second sample contained by the second carried laboratory sample container to a sample contained by the first laboratory sample container indirectly by use of the logic assignment of the sample container carrier to the first carried laboratory sample container may be wrong. So far it was possible, that this wrong logic assignment may have remained undetected.

The removal detector of the sample container carrier can enable the detection of a possible laboratory sample container interchange by detecting the removal. Since the laboratory sample container may be interchanged, it can be determined based on the detected removal whether the before valid logic assignment of the sample container carrier to the carried laboratory sample container is invalid. Thereby, a risk of a wrong logic assignment of an analytical result to a sample can be reduced or even eliminated. In other words, the laboratory system can ensure the integrity of a logic assignment of an analytical result to a sample and thereby to a corresponding patient.

In detail, the laboratory sample container may be a sample tube and/or may have an opening at an upper, top and/or face end. Furthermore, the laboratory sample container may be made of glass or transparent plastic or any other, in particular, somewhat, solid material. Moreover, the laboratory sample container or its opening, respectively, may be closed by a closure or a cap. The closure may comprise rubber and/or plastic or may completely consist of rubber and/or plastic. Further, the closure may be embodied as a foil such as, for example, a flexible foil, or film or tape or as a lid such as, for example, a rigid lid.

Furthermore, the laboratory sample container may be configured to contain a sample. The sample may be a blood sample, a serum sample, a plasma sample, a urine sample, a CFS sample, a body sample, a water sample, a chemical sample, and the like. For example, the sample may be a liquid. The laboratory sample container or its opening, respectively, may be open for processing such as, for example, analyzing, the sample, if present, contained by the laboratory sample container.

Moreover, the laboratory sample container may comprise an ID and in one embodiment, the ID may be unique. The ID may be representative of the sample, if present, contained by the laboratory sample container. In one embodiment, the ID may comprise or be a barcode. The ID of the laboratory sample container may be denoted as a container ID.

However, it may be too complicated, too time-consuming, or even impossible to directly use the laboratory sample container, in particular, its container ID, if present, for identification of the sample in the laboratory automation system all the time and/or in each situation such as, for example, in a workflow of the laboratory automation system.

Instead of container identification, the sample container carrier such as, for example, an ID of the sample container carrier, may be directly used for identification of the sample, if present, contained by the carried laboratory sample container in the laboratory automation system.

In one embodiment, the sample container carrier may be configured to comprise an ID, such as, for example, a unique ID. The ID may be representative of the sample container carrier and/or the carried laboratory sample container and/or the sample, if present, contained by the carried laboratory sample container. The ID of the sample container carrier may be denoted as a carrier ID.

The logic assignment may be an assignment of the carrier ID to the container ID. Further, the assignment may be denoted as link or association. Valid may be denoted as correct. Invalid may be denoted as incorrect.

Furthermore, the sample container carrier may not have to comprise any identification of the carried laboratory sample container and/or the sample, if present, contained by the laboratory sample container. In one embodiment, the sample container carrier may not have to comprise a reader for reading the container ID.

Moreover, the sample container carrier may be adapted or embodied to carry only one, or a single, laboratory sample container. The sample container carrier may be denoted as single sample container carrier. Further, the sample container carrier may be configured to move the carried laboratory sample container in a laboratory sample distribution system and/or in the laboratory automation system. In one embodiment, the carried laboratory sample container may be open.

In one embodiment, the sample container carrier may be configured to determine based on the detected removal that the before valid logic assignment of the sample container carrier to the carried laboratory sample container is invalid.

The removal detector may be configured to interact with the laboratory sample container contactless or by contact such as, for example, by contacting the laboratory sample container on the outside such as, for example on the circumference, of the laboratory sample container. In one embodiment, the removal detector may be configured to detect a presence of the laboratory sample container. The removal detector may be denoted as presence detector. Furthermore, the removal detector may be arranged in a bottom, or a laboratory sample container adapter, of the sample container carrier.

According to one embodiment, the removal detector can comprise a switch such as, for example, a microswitch, an optical sensor, a capacitive sensor, a pressure sensor, a temperature sensor, and/or a shape memory alloy configured to interact with the laboratory sample container to detect such as, for example, automatically detect, a removal of the carried laboratory sample container from the sample container carrier. In one embodiment, the switch may be a mechanical switch, which may be depressed by the laboratory sample container, if present, and not depressed, if the laboratory sample container is absent such as, for example, by a spring.

According to one embodiment, the sample container carrier can comprise a memory element. The memory element can be configured to store such as, for example, automatically store, information based on the detected removal, information based on whether the logic assignment is valid, and/or information based on whether the logic assignment is invalid. This may enable or allow that information does not have to be transmitted on or at detection or at determination, but, instead, may be transmitted at a later time. In one embodiment, the memory element may be a re-writable and/or non-volatile memory element. The memory element may be an electric memory element. In one embodiment, the memory element may comprise a capacitor, a flip-flop, or a latch, respectively, a microcontroller and/or a semiconductor memory. The memory element may have two such as, for example, stable, states and may be used to store state information. In one embodiment, a first state may be that the logic assignment is valid and in a different state, second state may be that the logic assignment is invalid. Information based on the detected removal may be a time of, or a time period since, the detected removal. The time or the time period may be compared with a time or a time period since the last such as, for example, intentional, removal of a laboratory sample container from the sample container carrier or since an intentional loading of the laboratory sample container on the sample container carrier such as, for example, by the laboratory system or a control device of the laboratory system, respectively. Based on the comparison, the laboratory system, or its control device, if present, may determine, that the before valid logic assignment of the sample container carrier to the carried laboratory sample container is invalid. The control device may comprise or be an integrated circuit, a tablet computer, a smartphone, a computer, or the like. Information based on that the logic assignment is valid may be information about the laboratory sample container such as, for example, the container ID, if present, and/or the sample, if present, contained by the laboratory sample container. Based on the detected removal, the valid information may be deleted or changed such that the invalid information may be generated.

According to an embodiment, the sample container carrier can comprise a receiver. The receiver can be configured to receive such as, for example, to automatically and/or wireless receive, information based on that the logic assignment is valid such as, for example, from outside the sample container carrier, and to store the information on the memory element. In one embodiment, this may be denoted to arm the sample container carrier or its memory element, respectively. The receiver may be different from the removal detector. Additionally, or alternatively, the receiver may be an electric receiver and/or a wireless receiver such as, for example, a radio receiver such as, for example, comprising an antenna.

According to an embodiment, the sample container carrier can comprise a transmitter. The transmitter can be configured to transmit such as, for example, to automatically and/or wireless transmit, information based on the detected removal, information based on whether the logic assignment is valid, and/or information, whether the logic assignment is invalid such as, for example, to outside the sample container carrier. In one embodiment, the transmitter may be different from the removal detector. Additionally, or alternatively, the transmitter may be an electric transmitter and/or a wireless transmitter such as, for example, a radio transmitter such as, for example, comprising an antenna. Information may be such as described above in the context of the memory element. In one embodiment, if the valid information is deleted, the transmitter may be configured not to transmit.

According to an embodiment, the sample container carrier can comprise a transponder. The transponder can comprise the transmitter and a receiver. Furthermore, the transponder can be configured to receive such as, for example, to automatically and/or wireless receive, an interrogation such as, for example, an interrogation signal or an interrogation wave, respectively, for the information such as, for example, by its receiver, and to transmit such as, for example, to automatically transmit, the information in response to the received interrogation such as, for example, by its transmitter. This may enable that only the interrogated sample container carrier transmits. In one embodiment, the transponder may be different from the removal detector. Additionally, or alternatively, the transponder may be an electric transponder and/or a wireless transponder such as, for example, a radio transponder. The transmitter and the receiver may be combined such as, for example, they may be denoted as transceiver. The receiver may be embodied as described above. In one embodiment, the transponder may be embodied as a radio-frequency identification (RFID) label or tag.

According to an embodiment, the transponder can be a near-field communication (NFC) transponder. This can enable that only the sample container carrier may be interrogated. In one embodiment, a communication range may be in the range from about 1 centimeter (cm) to about 10 cm, in another embodiment, from about 2 cm to about 8 cm, in yet another embodiment, from about 3 cm to about 6 cm, and in still yet another embodiment, about 4 cm.

According to an embodiment, the receiver can be configured to collect such as, for example to automatically collect, energy such as, for example, electrical energy and/or of the interrogation, and to supply such as, for example, to automatically supply, the sample container carrier such as, for example, its removal detector and/or its memory element, if present, with the collected energy. In one embodiment, the sample container carrier may be denoted as passive sample container carrier and/or power harvesting sample container carrier. In other words, the sample container carrier may be configured to be only supplied by the collected energy. Further, in other words, the sample container carrier may not have to comprise its own power source such as, for example, an accumulator and/or a battery.

According to an embodiment, the laboratory system can comprise a receiver station. The receiver station can be configured to receive such as, for example, to automatically and/or wireless receive, information based on the detected removal, information that the logic assignment is valid, and/or information that the logic assignment is invalid, from the sample container carrier. In one embodiment, the receiver station may be different from the sample container carrier. Additionally, or alternatively, the receiver station may be an electric receiver station and/or a wireless receiver station such as, for example a radio receiver station such as, for example, comprising an antenna such as, for example, a RDIF receiver station and/or a NFC receiver station. In one embodiment, the receiver station may be configured to transmit such as, for example, to automatically and/or wireless transmit, the interrogation. The receiver station may be denoted as reader station. Information may be such as described above in the context of the memory element. In one embodiment, if the valid information is deleted, the receiver station may not receive or not be able to read-out information. This can enable or allow the receiver station to recognize that the logic assignment is invalid.

According to an embodiment, the laboratory system can comprise a transmitter station. The transmitter station can be configured to transmit such as, for example, to automatically and/or wireless transmit, information that the logic assignment is valid, to the sample container carrier. In one embodiment, this may be denoted to arm the sample container carrier or its memory element, if present, respectively. Additionally, or alternatively, the transmitter station may be different from the sample container carrier. Furthermore, the transmitter station may be an electric transmitter station and/or a wireless transmitter station such as, for example a radio transmitter station such as, for example, comprising an antenna such as, for example, a RDIF transmitter station and/or a NFC transmitter station. The transmitter station may be denoted as writer station. Information may be such as described above in the context of the memory element.

According to an embodiment, the laboratory system can comprise a barcode reader and assignment station. The barcode reader and assignment station can be configured to read such as, for example, to automatically read, a barcode of the laboratory sample container and to logically assign such as, for example, to automatically assign, the read barcode to the sample container. In one embodiment, the barcode reader and assignment station may be configured to transmit the read barcode to the sample container carrier. Additionally, or alternatively, the barcode reader and assignment station may be different from the sample container carrier. Furthermore, the barcode reader and assignment station may be an electric barcode reader and assignment station such as, for example, the barcode reader and assignment station may comprise a camera.

According to an embodiment, the laboratory system can comprise a loading and assignment station. The loading and assignment station can be configured to load such as, for example, automatically load, the laboratory sample container on the sample container carrier and to determine such as, for example, to automatically determine that the logic assignment of the sample container carrier to the loaded laboratory sample container is valid. In one embodiment, the loading and assignment station may be configured to transmit information that the logic assignment of the sample container carrier to the loaded laboratory sample container is valid to the sample container carrier. Additionally, or alternatively, the loading and assignment station may be different from the sample container carrier. Furthermore, the loading and assignment station may be an electric loading and assignment station. Moreover, the loading and assignment station may be denoted as inserting and assignment station.

A laboratory sample distribution system for a laboratory automation system is also presented. The laboratory sample distribution system can comprise a laboratory system as described above, a transport plane, a number of drive elements (e.g. 1 to 10000) and a control device. The transport plane can be configured to support the sample container carrier such as, for example, with the carried laboratory sample container. The number of drive elements can be configured to move such as, for example, to automatically move, the sample container carrier such as, for example, with the carried laboratory sample container, on the transport plane. The control device can be configured to control such as, for example, to automatically control, the number of drive elements such that the sample container carrier can move on the transport plane along a corresponding such as, for example, individual, transport path.

By use of the laboratory system according, the advantages of the laboratory system, as discussed above, may be made applicable for the laboratory sample distribution system.

In one embodiment, the transport plane may be denoted as transport surface. To support the sample container carrier may be denoted to carry the sample container carrier. The sample container carrier may be translationally moved on or over the transport plane. Furthermore, the sample container carrier may be configured to move in two dimensions on the transport plane. Moreover, the sample container carrier may slide over the transport plane. In one embodiment, the laboratory sample distribution system may comprise a plurality of sample container carriers (e.g. 1 to 1000) such as, for example, as described above. The number of drive elements may be a number of electric drive elements. The control device may be configured to control the number of drive elements such that the plurality of sample container carriers can move on the transport plane along corresponding such as, for example, individual, transport paths simultaneously. Further, the control device may comprise or be an integrated circuit, a tablet computer, a smartphone or a computer.

Furthermore, the receiver station, the transmitter station, the barcode reader and assignment station and/or the loading and assignment station, if present, may be arranged adjacent or directly next to the laboratory sample distribution system such as, for example, to the transport plane of the laboratory sample distribution system.

According to an embodiment, the sample container carrier can comprise a magnetically active device. The number of drive elements can comprise a number of electro-magnetic actuators. The number of electro-magnetic actuators can be stationary arranged below the transport plane and can be configured to move such as, for example, to automatically move, the sample container carrier on the transport plane by applying a magnetic drive force to the sample container carrier. The control device can be configured to control such as, for example, to automatically control, the number of electro-magnetic actuators, such that the sample container carrier can move on the transport plane along the corresponding transport path.

In one embodiment, the number of electro-magnetic actuators may be configured to generate a magnetic field to move the sample container carrier on the transport plane. The magnetically active device may be configured to interact with the magnetic field generated by the number of electro-magnetic actuators such that the magnetic drive force can be applied to the sample container carrier. In one embodiment, the magnetically active device may be a permanent magnet or an electro-magnet. Additionally, or alternatively, the magnetically active device may comprise a magnetically soft material. The number of electro-magnetic actuators may be a number of solenoids surrounding ferromagnetic cores. Furthermore, the number of electro-magnetic actuators may be driven or energized individually in order to generate or to provide the magnetic field. Moreover, the electro-magnetic actuators may be arranged in two dimensions such as, for example, in a grid having rows and columns, along which the electro-magnetic actuators can be arranged. Further, the electro-magnetic actuators may be arranged in a plane substantially parallel to the transport plane.

Additionally, or alternatively, the number of drive elements may comprise at least one wheel and a drive motor to drive the wheel. The drive motor and the wheel may be configured to move such as, for example, to automatically move, the sample container carrier on the transport plane. The control device may be configured to control such as, for example, to automatically control, the at least one wheel and/or the drive motor such that the sample container carrier can move on the transport plane along the corresponding transport path. In one embodiment, the sample container carrier may comprise the at least one wheel and/or the at least one drive motor.

A laboratory automation system is also presented. The laboratory automation system can comprise a number of analytical stations. The number of analytical stations can be configured to analyze such as, for example, to automatically analyze, a sample. Furthermore, the laboratory automation system can comprise a laboratory system as described above and/or a laboratory sample distribution system as described above. The laboratory sample distribution system, if present, can be configured to move such as, for example, to automatically move, the sample container carrier to the number of analytical stations. The laboratory automation system or its control device, if present, can be configured to prevent such as, for example, to automatically prevent, analyzing and/or logically assigning an analytical result to the sample contained by the carried laboratory sample container based on the determined invalid logic assignment such as, for example, of the sample container carrier to the laboratory sample container.

By use of the laboratory system and/or the laboratory sample distribution system, the advantages of the laboratory system and/or the laboratory sample distribution system, as discussed above, may be made applicable for the laboratory automation system.

In other words, the laboratory automation system or its control device, if present, may be adapted to reject such as, for example, to automatically reject, the sample container carrier, the carried laboratory sample container and/or the sample contained by the laboratory sample container based on the determined invalid logic assignment. Additionally, or alternatively, the laboratory automation system or its control device, if present, may be configured to allow such as, for example, to automatically allow, analyzing and/or logically assigning the analytical result to the sample contained by the carried laboratory sample container based on such as, for example, the determined, valid logic assignment such as, for example, of the sample container carrier to the laboratory sample container.

The number of analytical stations may be different from the sample container carrier. In one embodiment, the number of analytical stations may be configured to use the sample or a part of the sample and a reagent to generate a measuring signal, the measuring signal indicating if and in which concentration, if any, an analyte exists.

Furthermore, the laboratory automation system may comprise a number of pre-analytical stations and/or post-analytical stations. The number of pre-analytical stations may be configured to perform any kind of pre-processing of the sample, the laboratory sample container and/or the sample container carrier. The number of post-analytical stations may be configured to perform any kind of post-processing of the sample, the laboratory sample container and/or the sample container carrier.

The number of pre-analytical, analytical and/or post-analytical stations may comprise at least one of a decapping station, a recapping station, an aliquot station, a centrifugation station, an archiving station, a pipetting station, a sorting station, a tube type identification station, a sample quality determining station, an add-on buffer station, a liquid level detection station, a sealing/desealing station, a pushing station, a belt station, a conveying system station and/or a gripper station for moving the laboratory sample container to or from the sample container carrier.

Moreover, the number of analytical, pre-analytical and/or post-analytical stations, if present, may be arranged adjacent or directly next to the laboratory sample distribution system, if present, such as, for example, to the transport plane of the laboratory sample distribution system.

In one embodiment, the laboratory sample distribution system, if present, may be configured to move the sample container carrier to the number of pre-analytical stations, post-analytical stations, the receiver station, the transmitter station, the barcode reader and assignment station and/or the loading and assignment station, if present. In one embodiment, the laboratory sample distribution system may be configured to move the sample container carrier in between the stations.

FIGS. 1 to 12 show a laboratory automation system 10. The laboratory automation system 10 can comprise a laboratory sample distribution system 100. The laboratory sample distribution system 100 can comprise a laboratory system 200.

Figure 1:
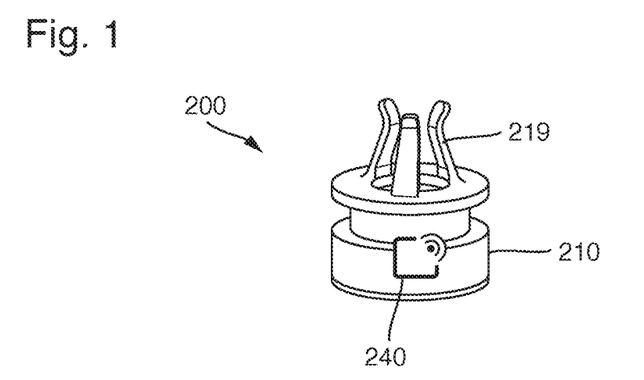
FIG. 1 illustrates a perspective view of a sample container carrier of a laboratory system according to an embodiment of the present disclosure.

The laboratory system 200 can comprise a sample container carrier 210. The sample container carrier 210 can be configured to carry a laboratory sample container 130 and can comprise a removal detector 220. The removal detector 220 can be configured to interact with the laboratory sample container 130 to detect a removal of the carried laboratory sample container 130 from the sample container carrier 210. Furthermore, the laboratory system 200 can be configured to determine based on the detected removal that a before valid logic assignment of the sample container carrier 210 to the carried laboratory sample container 130 is invalid.

In the shown embodiment, the laboratory sample container 130 can be designed as a tube and can have an opening 131 such as, for example, at an upper, end, as shown in FIGS. 2 and 8-12. Furthermore, the laboratory sample container 130 can contain a liquid sample 139.

In detail, the sample container carrier 210 can comprise at least one holding element 219, as shown in FIGS. 1, 8-10, and 12. The at least one holding element 219 can be configured to hold the laboratory sample container 130 such as, for example, at a circumference of the laboratory sample container 130. Moreover, the sample container carrier 130 can comprise a holding region such as, for example, defined by the at least one holding element 219, for the laboratory sample container 130.

The removal detector 220 can be arranged in a bottom of the sample container carrier 210, such as, for example, at lower end of the holding region.

In the shown embodiment, the removal detector 220 can be configured to interact with the laboratory sample container 130 by contact such as, for example, by contacting the laboratory sample container 130 at its circumference. In detail, the removal detector 220 can comprise a switch 221 such as, for example, a mechanical switch, as shown in FIGS. 2-7. The switch 221 can be configured to be depressed such as, for example, by a spring by the laboratory sample container 130, if present, and not depressed, if the laboratory sample container 130 is absent.

In alternative embodiments, the removal detector may be configured to interact with the laboratory sample container contactless. Additionally, or alternatively, in alternative embodiments, the removal detector may comprise an optical sensor, a capacitive sensor, a pressure sensor, a temperature sensor, and/or a shape memory alloy configured to interact with the laboratory sample container to detect a removal of the carried laboratory sample container from the sample container carrier.

Further, the sample container carrier 210 can comprise a memory element 230. In the shown embodiment, the memory element 230 can be configured to store information based on that the logic assignment is valid and information based on that the logic assignment is invalid. In alternative embodiments, the memory element may be configured to store information based on the detected removal, in particular a time of or a time period since the detected removal.

Figure 2:
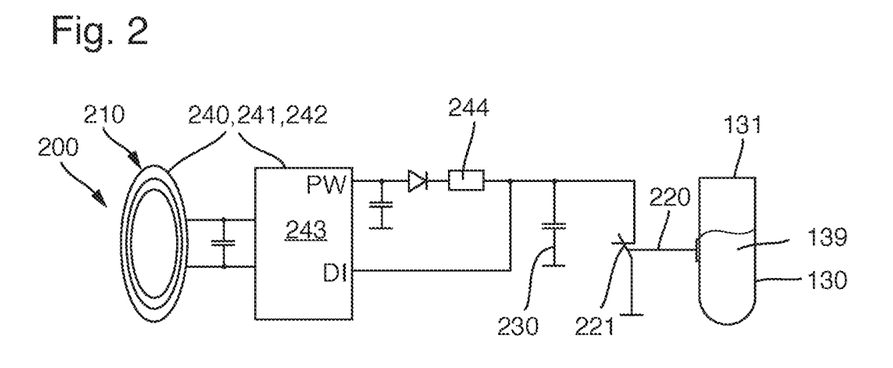
FIG. 2 illustrates a schematic diagram of the sample container carrier of FIG. 1 comprising a memory element in form of a capacitor according to an embodiment of the present disclosure.
Figure 3:
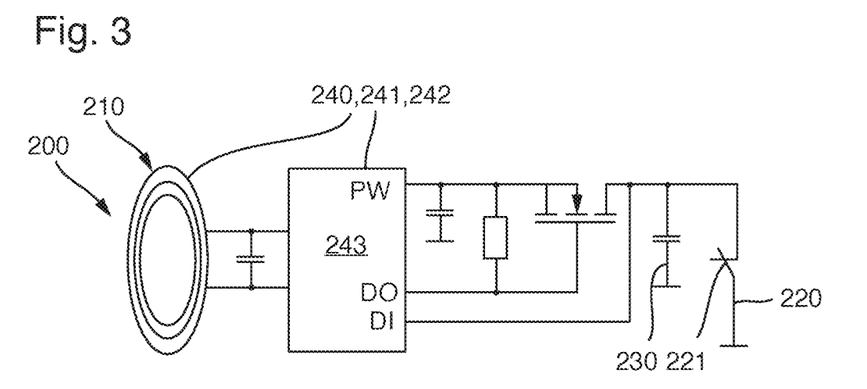
FIG. 3 illustrates another schematic diagram of the sample container carrier of FIG. 1 comprising a memory element in form of a capacitor according to an embodiment of the present disclosure.
Figure 4:
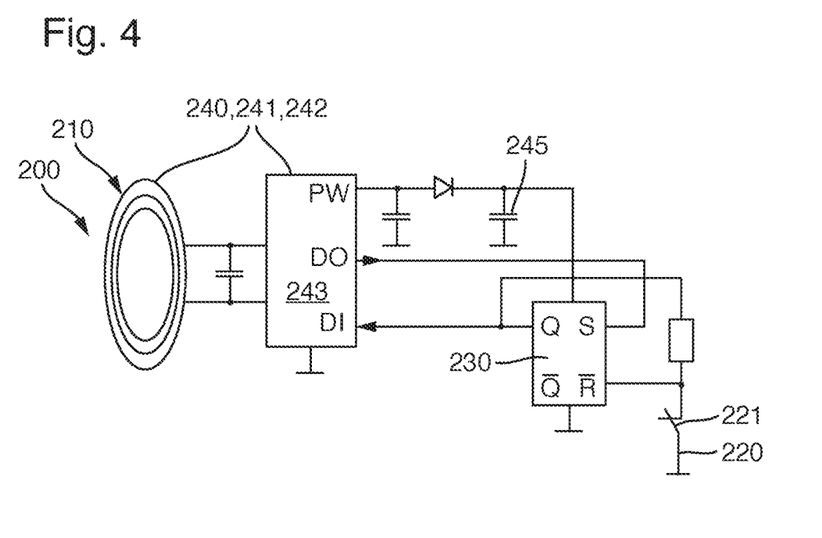
FIG. 4 illustrates shows another schematic diagram of the sample container carrier of FIG. 1 comprising a memory element in form of a flip-flop according to an embodiment of the present disclosure.
Figure 5:
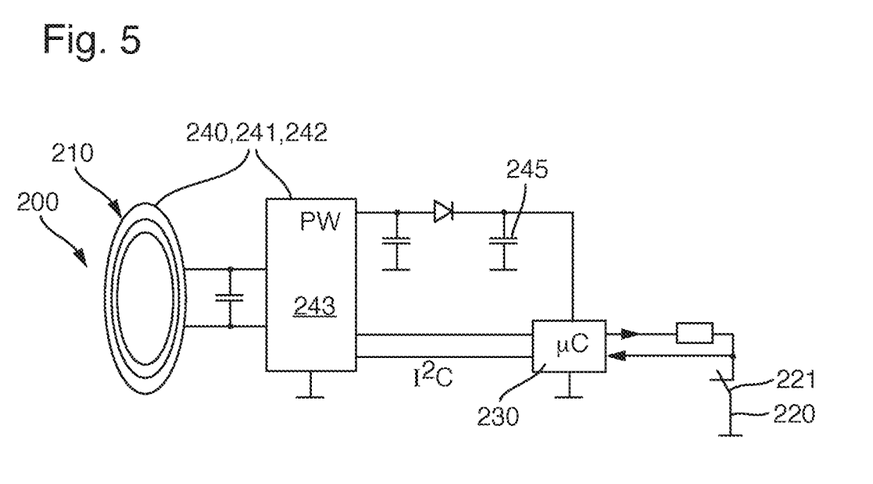
FIG. 5 illustrates another schematic diagram of the sample container carrier of FIG. 1 comprising a memory element in form of a microcontroller according to an embodiment of the present disclosure.
Figure 6:
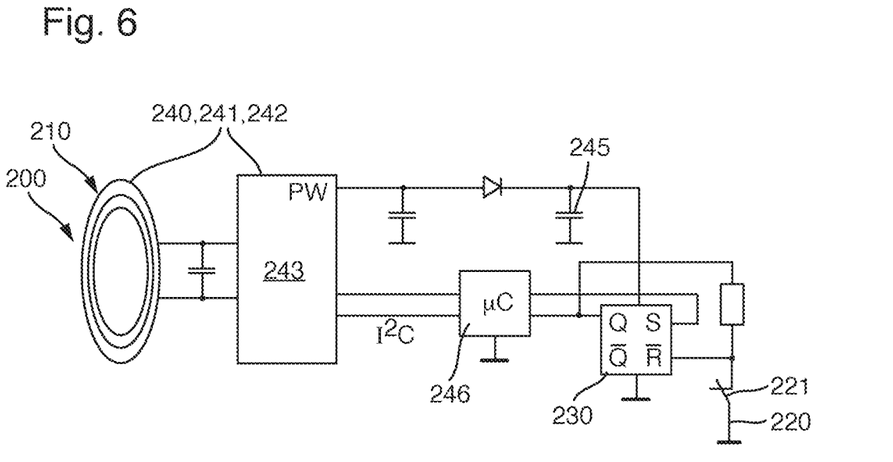
FIG. 6 illustrates another schematic diagram of the sample container carrier of FIG. 1 comprising a memory element in form of a flip-flop according to an embodiment of the present disclosure.
Figure 7:
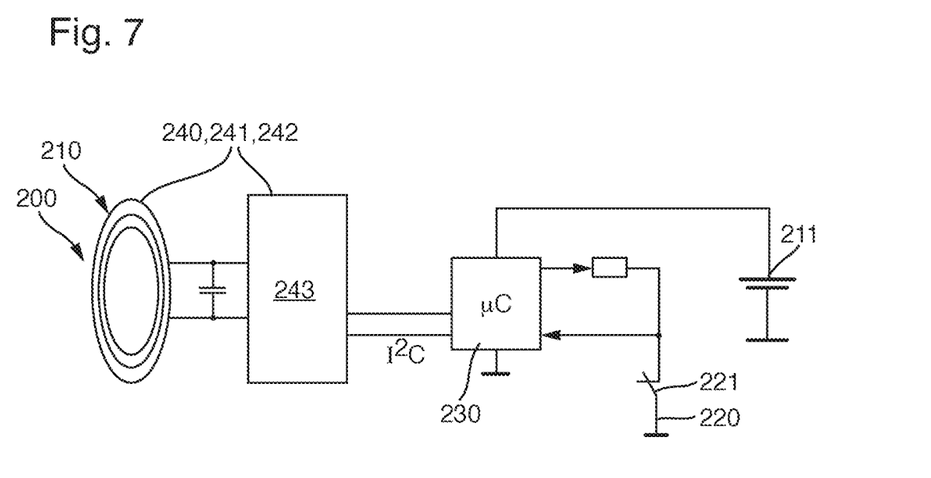
FIG. 7 illustrates another schematic diagram of the sample container carrier of FIG. 1 comprising a memory element in form of a microcontroller according to an embodiment of the present disclosure.

In detail, the memory element 230 can comprise a capacitor in FIGS. 2 and 3, a flip-flop in FIGS. 4 and 6, and a microcontroller in FIGS. 5 and 7. In one embodiment, the memory element can have two states. In a first state, the logic assignment is valid and, in a second state, the logic assignment is invalid.

Furthermore, the sample container carrier 210 can comprise a transponder 240 such as, for example, a RFID, NFC transponder such as, for example, comprising an antenna. The transponder 240 can comprise a receiver 241 and a transmitter 242.

The receiver 241 can be configured to receive information based on that the logic assignment is valid and to store the information on the memory element 230. This may be denoted to arm the sample container carrier 210 or its memory element 230, respectively.

In the shown embodiment, the transmitter 242 can be configured to transmit information based on that the logic assignment is valid. In alternative embodiments, the transmitter may be configured to transmit information based on the detected removal and/or information that the logic assignment is invalid.

In detail, the removal detector 220 can be configured to delete information based on that the logic assignment is valid such as, for example, from the memory element 230, based on the detected removal. In other words, the removal detector 220 can be configured to store information based on that the logic assignment is invalid such as, for example, on the memory element 230. If the valid information is deleted or the information is that the logic assignment is invalid, respectively, the transmitter 242 does not transmit.

In one embodiment, the transponder 240 can be configured to receive an interrogation for the information such as, for example, by its receiver 241, and to transmit the information such as, for example, that the logic assignment is valid, in response to the received interrogation such as, for example, by its transmitter 242.

Moreover, in FIGS. 2-6, the receiver 241 can be configured to collect energy such as, for example, from the received information and/or from the interrogation, and to supply the sample container carrier 210 such as, for example, its memory element 230, with the collected energy.

In FIG. 7, the sample container carrier 210 can comprise its own power source 211 such as, for example, a battery.

Figure 8:
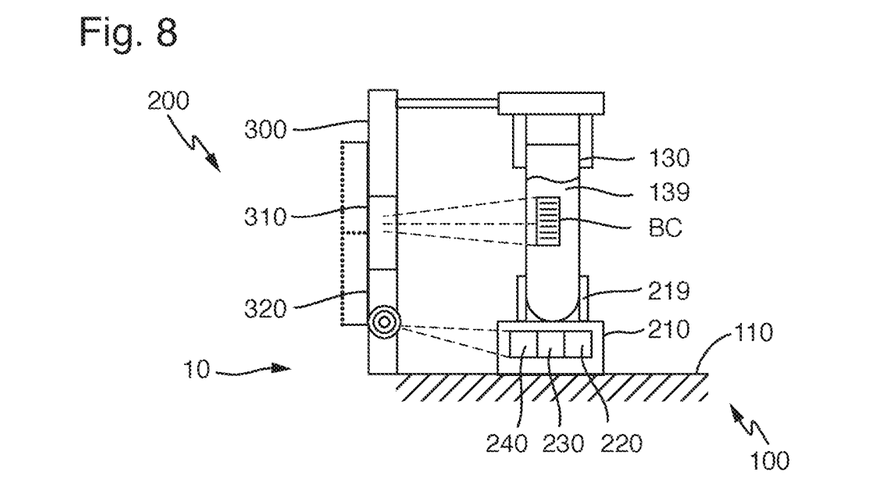
FIG. 8 illustrates a side view of a loading and assignment station, a barcode reader and assignment station and a transmitter station of the laboratory system according to an embodiment of the present disclosure.

Further, the laboratory system 200 can comprise a loading and assignment station 300 such as, for example, comprising a gripper, as shown in FIG. 8. The loading and assignment station 300 can be configured to load the laboratory sample container 130 on the sample container carrier 210 and to determine that the logic assignment of the sample container carrier 210 to the loaded laboratory sample container 300 is valid.

Furthermore, the laboratory system 200 can comprise a barcode reader and assignment station 310 such as, for example, comprising a camera. The barcode reader and assignment station 310 can be configured to read a barcode (BC) of the laboratory sample container 130 and to logically assign the read barcode (BC) to the sample container 210.

Moreover, the laboratory system can comprise a transmitter station 320 such as, for example, a RFID, NFC transmitter station such as, for example, comprising an antenna. The transmitter station 320 can be configured to transmit information that the logic assignment is valid to the sample container carrier 210. This may be denoted to arm the sample container carrier 210 or its memory element 230, respectively. In one embodiment, the transmitter station 320 can be configured to transmit energy such as, for example, with the information to the sample container carrier 210.

In the shown embodiment, the transmitter station 320 can transmit the read barcode (BC) of the laboratory sample container 130 to the sample container 210. Thereby, information that the logic assignment of the sample container carrier 210 to the loaded laboratory sample container 130 is valid can be transmitted to the sample container carrier 210. In one embodiment, the loading and assignment station 300, the barcode reader and assignment station 310, and the transmitter station 320 can be functionally coupled such as, for example, in signal connection with each other, as shown in FIG. 8 by a dotted line.

In detail, the sample container carrier 210 or its transponder 240, respectively, can comprise a control circuit 243. The received barcode (BC) can be stored by the control circuit 243.

Figure 9:
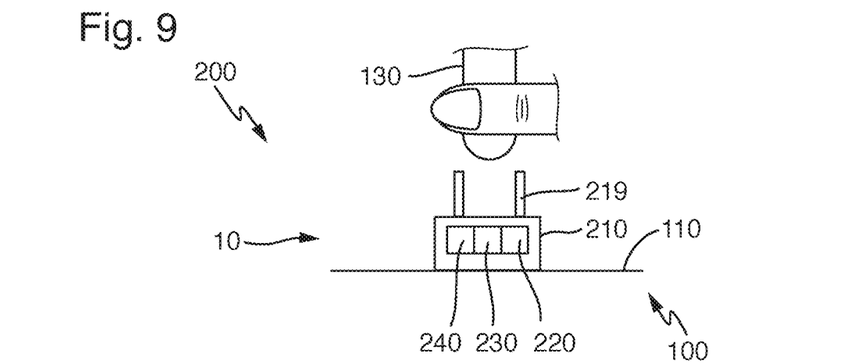
FIG. 9 illustrates a removal of a laboratory sample container from the sample container carrier of FIG. 1 according to an embodiment of the present disclosure.

Further, the memory element 230 comprising the capacitor in FIG. 2 can be charged by power harvesting such as, for example, via a power harvesting output PW of the transponder 240 or its control circuit 243, respectively. When the laboratory sample container 130 is removed, as shown in FIG. 9, the capacitor 230 can be uncharged. The memory state can be read out by the transponder 240 or its control circuit 243, respectively such as, for example, via a digital input (DI) of the control circuit 243, with the next interrogation. Furthermore, the sample container carrier 210 can comprise a time-delay-resistor 244 such as, for example, in order to avoid a too fast recharge of the capacitor 230 such as, for example, during the next interrogation. If the memory state is the second state that the logic assignment is invalid, the stored barcode (BC) can be deleted by the control circuit 243 and no response can be transmitted. If the memory state is the first state that the logic assignment is valid, the stored barcode (BC) can be transmitted.

The memory element 230 comprising the capacitor in FIG. 3 can be charged by power harvesting such as, for example, triggered by a digital output (DO) of the control circuit 243. When the laboratory sample container 130 is removed, the capacitor 230 can be uncharged. The memory state can be read out by the transponder 240 or its control circuit 243, respectively, with the next interrogation, wherein a recharge of the capacitor 230 can be avoided by not triggering the digital output (DO).

The memory element 230 comprising the flip-flop such as, for example, a RS flip-flop, in FIG. 4 can be buffered by a capacitor 245 charged by power harvesting. The flip-flop 230 can be set by the digital output (DO). When the laboratory sample container 130 is removed, the flip-flop 230 can be reset. The memory state can be read out by the transponder 240 or its control circuit 243, respectively, with the next interrogation, wherein a setting of the flip-flop 230 can be avoided by not triggering the digital output (DO).

The memory element 230 comprising the microcontroller in FIG. 5 can be buffered by the capacitor 245 charged by power harvesting. The microcontroller 230 can check the removal detector 220 or a status of the removal detector 220, respectively, and can store it. The memory state can be read out by the transponder 240 or its control circuit 243, respectively, with the next interrogation such as, for example, by a bus connection in between the control circuit 243 and the microcontroller 230.

The memory element 230 comprising the flip-flop such as, for example, a RS flip-flop, in FIG. 6 can be buffered by the capacitor 245 charged by power harvesting. The flip-flop 230 can be set by the digital output (DO). When the laboratory sample container 130 is removed, the flip-flop 230 can be reset. A microcontroller 246 can be supplied by power harvesting such as, for example, with the collected energy. The memory state can be read out by the transponder 240 or its control circuit 243, respectively, with the next interrogation such as, for example, by a bus connection in between the control circuit 243 and the flip-flop 230 via the microcontroller 246. In other words, the microcontroller 246 can be configured, in particular only configured, for communication between the control circuit 243 and the flip-flop 230.

The memory element 230 comprising the microcontroller in FIG. 7 can be powered by the power source 211. The microcontroller 230 can check the removal detector 220 or a status of the removal detector 220, respectively, and can store it such as, for example, by a signal from a digital output to a digital input. When the laboratory sample container 130 is removed, the digital input can detect this. The digital output may be set to low, in what may save energy. The memory state can be read out by the transponder 240 or its control circuit 243, respectively, with the next interrogation such as, for example, by a bus connection in between the control circuit 243 and the microcontroller 230.

In other words, the sample container carrier 210 can be configured to determine based on the detected removal that the before valid logic assignment of the sample container carrier 210 to the carried laboratory sample container 130 is invalid.

Figure 10:
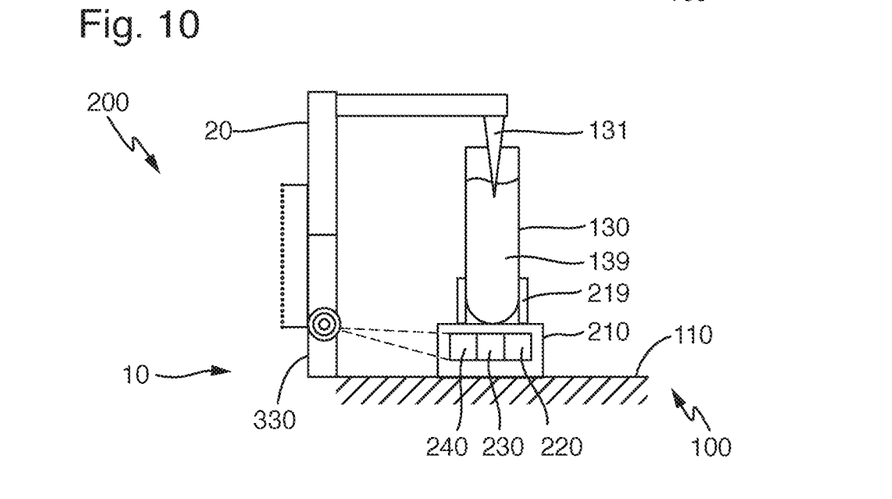
FIG. 10 illustrates a side view of a receiver station of the laboratory system and an analytical station of the laboratory automation according to an embodiment of the present disclosure.

Further, the laboratory system 200 can comprise a receiver station 330 such as, for example, a RFID, NFC receiver station such as, for example, comprising an antenna, as shown in FIG. 10. In the shown embodiment, the receiver station 330 can be configured to receive information based on that the logic assignment is valid such as, for example, the barcode (BC) of the laboratory sample container 130 from the sample container carrier 210. In alternative embodiments, the receiver station may be configured to receive information based on the detected removal and/or information that the logic assignment is invalid.

In detail, the receiver station 330 can be configured to transmit the interrogation and the sample container carrier 210 responds, if the logic assignment is still valid. If the valid information is deleted, the sample container carrier 210 does not respond and the receiver station 330 does not receive information. This can enable the receiver station 330 to recognize that the logic assignment is invalid. In one embodiment, the receiver station 330 can be configured to transmit energy such as, for example, with the interrogation to the sample container carrier 210.

Furthermore, the laboratory automation system 10 can comprise a number of analytical stations 20. The number of analytical stations 20 can be configured to analyze the sample 139. The laboratory automation system 200 can be configured to prevent analyzing such as, for example, by the number of analytical stations 20, and/or logically assigning an analytical result to the sample 139 contained by the carried laboratory sample container 130 based on the determined invalid logic assignment. In one embodiment, the sample container carrier 210 can be rejected based on the determined invalid logic assignment.

Additionally, the laboratory automation system 10 can be configured to allow analyzing and/or logically assigning the analytical result to the sample 139 contained by the carried laboratory sample container 130 based on the valid logic assignment.

In one embodiment, the receiver station 330 and the number of analytical stations 20 can be functionally coupled such as, for example, in signal connection with each other, as shown in FIG. 10 by a dotted line.

The logic assignment such as, for example, from the sample container carrier 210 transmitted and from the receiver station 330 received valid logic assignment in form of the barcode (BC), can allow or can make it possible to control and track the laboratory sample container 130 or the sample 139 contained by the laboratory sample container 139, respectively, over a workflow or a processing path, respectively.

Figure 11:
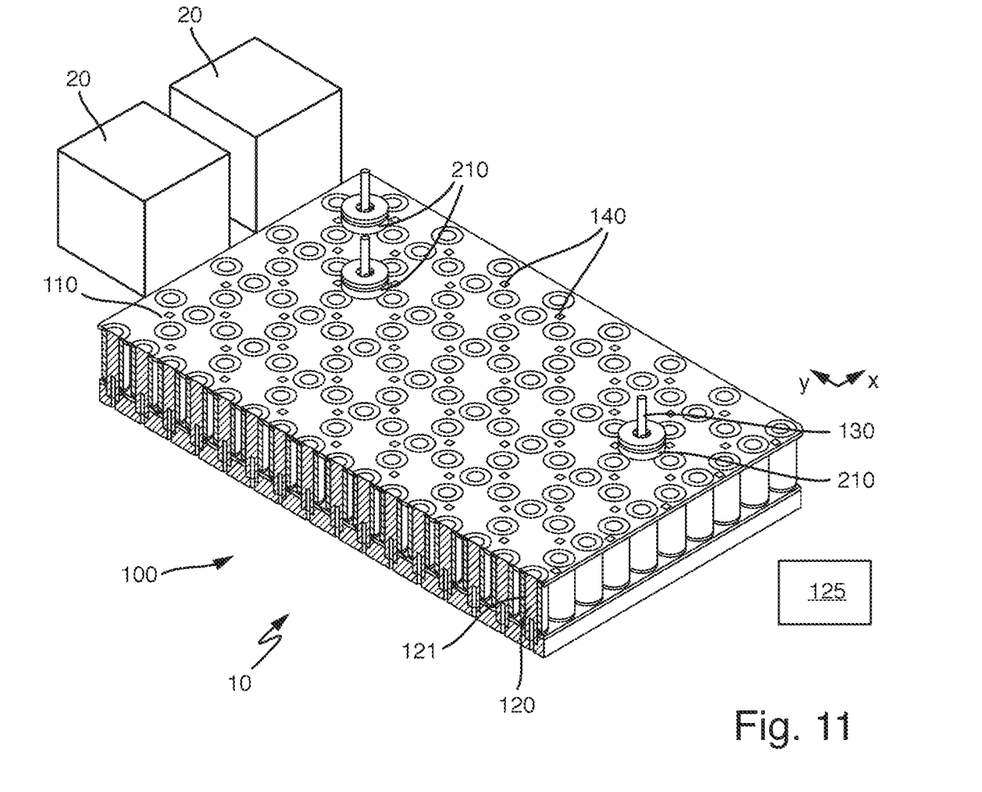
FIG. 11 illustrates a perspective view of the laboratory sample distribution system according to an embodiment of the present disclosure.

Self-evidently, more than the two analytical stations 20 shown in FIG. 11 may be comprised in the laboratory automation system 10.

The laboratory sample container 130 or its opening 131, respectively, can be open for processing such as, for example, analyzing, the sample 139 contained by the laboratory sample container 130.

Moreover, the sample container carrier 210 can be configured to move the carried such as, for example, an open, laboratory sample container 130 in the laboratory sample distribution system 100, as shown in FIG. 8-11, and/or in the laboratory automation system 10.

The laboratory sample distribution system 100 can comprise a transport plane 110, a number of drive elements 120, and a control device 125. The transport plane 110 can be configured to support the sample container carrier 210. The number of drive elements 120 can be configured to move the sample container carrier 210 on the transport plane 110. The control device 125 can be configured to control the number of drive elements 120 such that the sample container carrier 210 can move on the transport plane 110 along a corresponding transport path.

Further, the laboratory automation system 10 can comprise a number of pre-analytical stations and/or post-analytical stations.

The loading and assignment station 300, the barcode reader and assignment station 310, the transmitter station 320, the receiver station 330, the number of analytical stations 20, the number of pre-analytical stations, and the number of post-analytical stations can be arranged adjacent to the laboratory sample distribution system 100 such as, for example to the transport plane 110.

Furthermore, the laboratory sample distribution system 100 can be configured to move the sample container carrier 210 to the loading and assignment station 300, the barcode reader and assignment station 310, the transmitter station 320, the receiver station 330, the number of analytical stations 20, the number of pre-analytical stations, and the number of post-analytical stations.

Moreover, the control device 125 can be configured to control the loading and assignment station 300, the barcode reader and assignment station 310, the transmitter station 320, the receiver station 330, the number of analytical stations 20, the number of pre-analytical stations, and the number of post-analytical stations.

In detail, the sample container carrier 210 can be translationally moved in two dimensions x, y being substantially perpendicular to each other on the transport plane 110. In the shown embodiment, a sliding surface of the sample container carrier 210 can be configured to be in contact with the transport plane 110 and can enable performing movements such as, for example, slides, of the sample container carrier 210 on the transport plane 110. In one embodiment, the laboratory sample distribution system 100 can comprise a plurality of sample container carriers 110. Self-evidently, more than the three sample container carriers 210 shown in FIG. 11 may be comprised in the laboratory sample distribution system 100. The control device 125 can be configured to control the number of drive elements 120 such that the plurality of sample container carriers 210 can move on the transport plane 110 along corresponding such as, for example, individual, transport paths, simultaneously.

Figure 12:
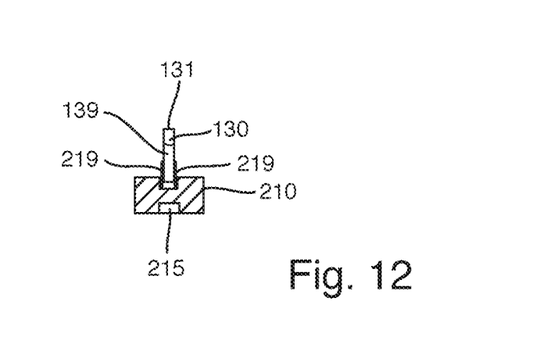
FIG. 12 illustrates a side view of the sample container carrier of FIG. 1 according to an embodiment of the present disclosure.

In the shown embodiment, the sample container carrier 210 can comprise a magnetically active device 215 such as, for example, in the form of a permanent magnet, as shown in FIG. 12. The number of drive elements 120 can comprise a number of electro-magnetic actuators 121. The number of electro-magnetic actuators 121 can be stationary arranged below the transport plane 110 and can be configured to move the sample container carrier 210 on the transport plane 110 by applying a magnetic drive force to the sample container carrier 210. The control device 125 can be configured to control the number of electro-magnetic actuators 121 such that the sample container carrier 210 can move on the transport plane 110 along the corresponding transport path.

In detail, the number of electro-magnetic actuators 121 can be configured to generate a magnetic field to move the sample container carrier 210 on the transport plane 110. The magnetically active device 215 can be configured to interact with the magnetic field generated by the number of electro-magnetic actuators 121 such that the magnetic drive force can be applied to the sample container carrier 210. Furthermore, the number of electro-magnetic actuators 121 can be driven individually in order to generate the magnetic field. In one embodiment, the number of electro-magnetic actuators 121 can be implemented as solenoids having a solid ferromagnetic core. Moreover, the electro-magnetic actuators 121 can be quadratically arranged in a grid having rows and columns such as, for example, in a plane substantially parallel to the transport plane 110. In each center of a quadrat formed by corresponding electro-magnetic actuators 121, no electro-magnetic actuator can be arranged. In other words, in each second row and in each second position, there can be no electro-magnetic actuator 121.

Further, the laboratory sample distribution system 100 can comprise a number of Hall-sensors 140. The number of Hall-sensors 140 can be arranged such that a position of a respective sample container carrier 210 on the transport plane 110 can be detected. The control device 125 can be functionally coupled to such as, for example, in signal connection with, the Hall-sensors 140 for detecting the position of the sample container carrier 210. The control device 125 can be configured to control the electro-magnetic actuators 121 in response to the detected position.

As the above discussed embodiments reveal, a laboratory system can be provided that can ensure integrity of a logic assignment of an analytical result to a sample. Furthermore, a laboratory sample distribution system can be provided comprising such a laboratory system and a laboratory automation system comprising such a laboratory system and/or such a laboratory sample distribution system.

It is noted that terms like "preferably," "commonly," and "typically" are not utilized herein to limit the scope of the claimed embodiments or to imply that certain features are critical, essential, or even important to the structure or function of the claimed embodiments. Rather, these terms are merely intended to highlight alternative or additional features that may or may not be utilized in a particular embodiment of the present disclosure.

For the purposes of describing and defining the present disclosure, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Having described the present disclosure in detail and by reference to specific embodiments thereof, it will be apparent that modifications and variations are possible without departing from the scope of the disclosure defined in the appended claims. More specifically, although some aspects of the present disclosure are identified herein as preferred or particularly advantageous, it is contemplated that the present disclosure is not necessarily limited to these preferred aspects of the disclosure.

We claim:

1. A laboratory system for a laboratory automation system, wherein the laboratory automation system comprises a number of analytical stations, the laboratory system comprising:

a sample container carrier comprising a memory element, a transmitter and a receiver, wherein the sample container carrier is configured to carry only one laboratory sample container between the number of analytical stations, the sample container carrier having a logic assignment to the carried laboratory sample container;

a removal detector arranged in a bottom of a holding region of the sample container carrier and in contact with a lower end of the laboratory sample container's outside circumference, wherein the removal detector comprises a switch, wherein when a laboratory sample container is present in the sample container carrier, the switch is depressed by the lower end of the laboratory sample container, wherein the removal detector detects a removal of the carried laboratory sample container from the sample container carrier when the switch is no longer depressed by the lower end of the laboratory sample container, wherein the memory element is encoded with information based on information based on whether the logic assignment of the sample container carrier is valid, and/or information based on whether the logic assignment of the sample container carrier is invalid, wherein the laboratory system determines based on a detected removal that a previously valid logic assignment of the sample container carrier to the carried laboratory sample container is now invalid and in response to the detected removal the previously valid logic assignment is deleted from memory, wherein the receiver receives information based on whether the logic assignment is valid, and stores the information on the memory element, and a control device configured to control the transmitter:

to transmit information based on whether the logic assignment is valid, and to not transmit if the previously valid logic assignment was deleted and/or the logic assignment is invalid.

2. The laboratory system according to claim 1, further comprising:

a receiver station, wherein the receiver station receives information from the sample container carrier based on whether the logic assignment is valid.

3. The laboratory system according to claim 1, further comprising a transmitter station, wherein the transmitter station is configured to transmit information whether the logic assignment is valid to the sample container carrier.

4. The laboratory system according to claim 1, further comprising:

a barcode reader and assignment station, the control device controlling the barcode reader and assignment station to read a barcode of the laboratory sample container and to logically assign the read barcode to the sample container.

5. The laboratory system according to claim 1, further comprising:

a loading and assignment station, the control device controlling the loading and assignment station to load the laboratory sample container on the sample container carrier and to transmit to the sample container carrier that the logic assignment of the sample container carrier to the loaded laboratory sample container is valid.

6. A laboratory sample distribution system for a laboratory automation system, the laboratory sample distribution system comprising:

the laboratory system according to claim 1;

a transport plane, wherein the transport plane is configured to support the sample container carrier; and a number of drive elements, wherein the number of drive elements is configured to move the sample container carrier on the transport plane, the control device controlling the number of drive elements such that the sample container carrier moves on the transport plane along a corresponding transport path.

7. The laboratory sample distribution system according to claim 6, wherein the sample container carrier comprises a magnetically active device, wherein the number of drive elements comprises a number of electro-magnetic actuators, wherein the number of electro-magnetic actuators is stationarily arranged below the transport plane and is configured to move the sample container carrier on the transport plane by applying a magnetic drive force to the sample container carrier, and wherein the control device controls the number of electro-magnetic actuators such that the sample container carrier moves on the transport plane along the corresponding transport path.

8. A laboratory automation system, the laboratory automation system comprising:

a number of analytical stations, wherein the number of analytical stations is configured to analyze a sample; and the laboratory sample distribution system according to claim 6, wherein the laboratory sample distribution system is configured to move the sample container carrier to the number of analytical stations, wherein the laboratory automation system is configured to prevent analyzing and/or logically assigning an analytical result to the sample contained by the carried laboratory sample container based on the determined invalid logic assignment.

* * * * *